(12) United States Patent
Schmid et al.

(10) Patent No.: US 7,115,897 B2
(45) Date of Patent: Oct. 3, 2006

(54) SEMICONDUCTOR CIRCUIT CONFIGURATION AND SEMICONDUCTOR MEMORY DEVICE

(75) Inventors: Günter Schmid, Hemhofen (DE); Marcus Halik, Erlangen (DE); Hagen Klauk, Erlangen (DE); Christine Dehm, Nürnberg (DE); Thomas Haneder, Dachau (DE); Thomas Mikolajick, Dresden (DE)

(73) Assignee: Infineon Technologies AG, Munich (DE)

(*) Notice: Subject to any disclaimer, the term of this patent is extended or adjusted under 35 U.S.C. 154(b) by 16 days.

(21) Appl. No.: 10/395,455

(22) Filed: Mar. 24, 2003

(65) Prior Publication Data
US 2003/0234428 A1    Dec. 25, 2003

(30) Foreign Application Priority Data
Mar. 22, 2002    (DE) .................. 102 12 878

(51) Int. Cl.
*H01L 29/08* (2006.01)
*H01L 29/10* (2006.01)
*H01L 29/76* (2006.01)

(52) U.S. Cl. .................. 257/40; 257/67; 257/300; 257/369

(58) Field of Classification Search ............ 257/67–70, 257/338, 369, 379, 40, 295, 296, 300, 903, 257/904
See application file for complete search history.

(56) References Cited

U.S. PATENT DOCUMENTS

| 4,442,447 A | 4/1984 | Ipri et al. |
| 4,920,391 A * | 4/1990 | Uchida ................. 365/149 |
| 6,667,215 B1 * | 12/2003 | Theiss et al. ............... 438/299 |

FOREIGN PATENT DOCUMENTS

DE    33 34 295 T1    3/1984

OTHER PUBLICATIONS

C. D. Dimitrakopoulus and D. J. Mascaro, "Organic thin film transistors: A review of recent Advances," IBM J. Res. & Dev. vol. 45 No., Jan. 1, 2001.

* cited by examiner

*Primary Examiner*—Hung Vu
(74) *Attorney, Agent, or Firm*—Laurence A. Greenberg; Werner H. Stemer; Ralph E. Locher

(57) ABSTRACT

A semiconductor circuit configuration has at least one pair of complementary operating field-effect transistors in which each transistor has a gate region, first and second source/drain regions and also a channel region with or made of an organic semiconductor material that is provided in between. It is furthermore provided that the gate regions are formed such that they are electrically coupled to one another via a capacitor configuration.

57 Claims, 5 Drawing Sheets

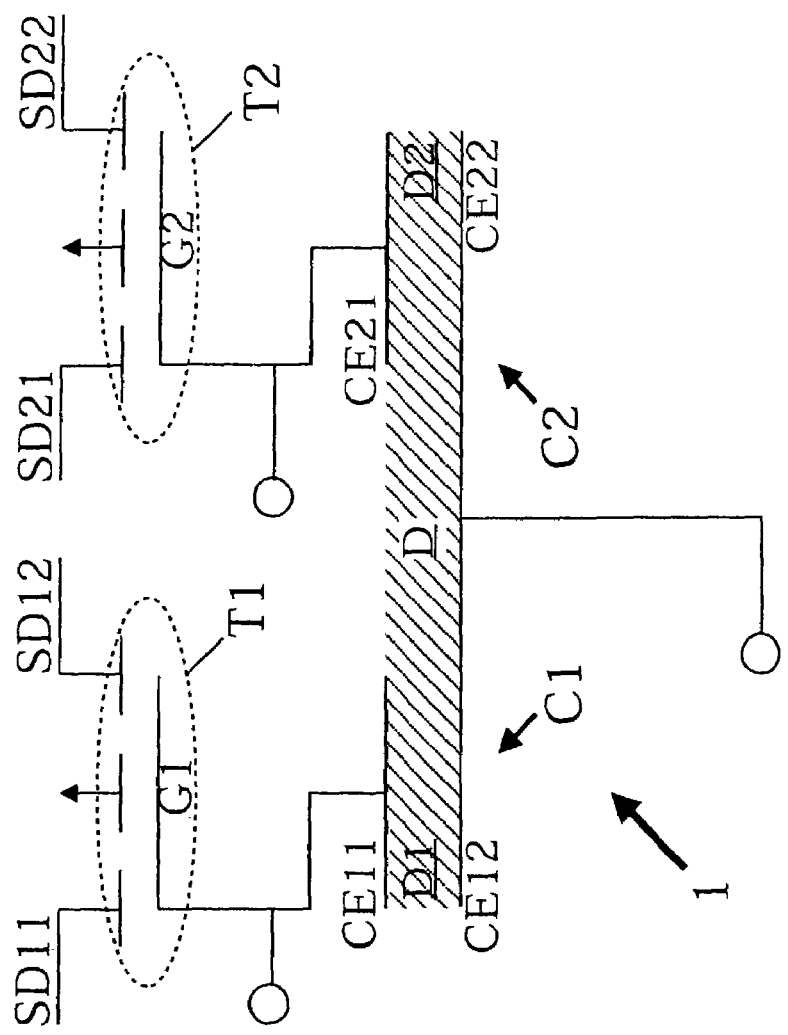
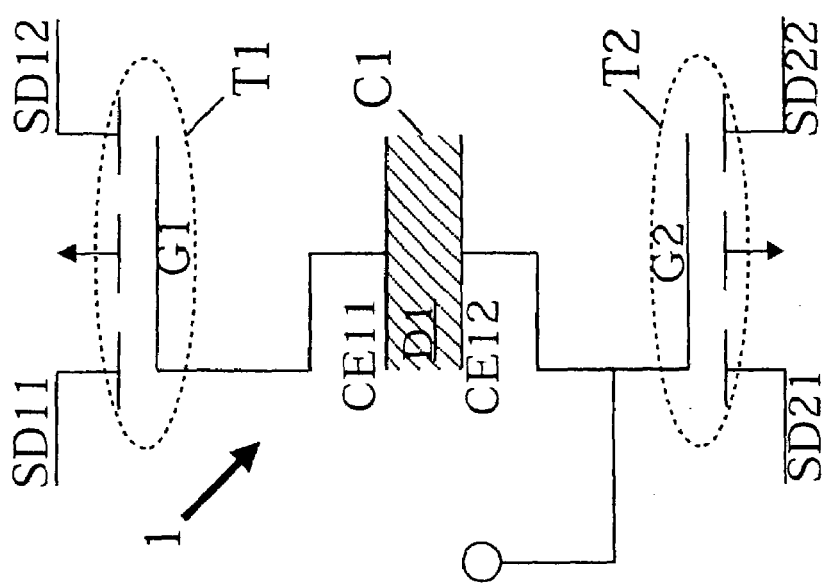
Fig. 3 B
Fig. 3 A

SEMICONDUCTOR CIRCUIT CONFIGURATION AND SEMICONDUCTOR MEMORY DEVICE

BACKGROUND OF THE INVENTION

Field of the Invention

The invention relates to a semiconductor circuit configuration having at least one pair of complementary field-effect transistor devices and to a semiconductor memory device.

Circuit configurations and, in particular, semiconductor circuit configurations are generally constructed from a multiplicity of components, in particular semiconductor components, in a very confined space. In this case, in many applications, complementary field-effect transistor devices and, in particular, complementary field-effect transistors play a significant part in terms of circuitry in the semiconductor circuit configurations.

In the complementary field-effect transistor devices, one of the terminals of each of the complementary field-effect transistor devices, namely the gate terminal as a rule, are formed such that they are electrically coupled to one another, so that, in the event of a given drive signal present for the pair of complementary field-effect transistor devices, one transistor is in the on state, and the other transistor is in the off state.

In the conventional realization of coupled field-effect transistor devices based on silicon technology, the complementary field-effect transistor devices of the pair are in each case formed by an n-type field-effect transistor and by a p-type field-effect transistor, respectively. What is problematic in this case, however, is that the respective n-type regions and p-type regions have to be formed such that they are coordinated with one another so that the field-effect transistor devices have approximately identical characteristics with regard to the switch-on operation, the switch-off operation, and the power consumption.

SUMMARY OF THE INVENTION

It is accordingly an object of the invention to provide a semiconductor circuit configuration having at least one pair of complementary or complementary acting or operating field-effect transistor devices, which overcomes the above-mentioned disadvantages of the prior art apparatus and methods of this general type.

In particular, it is an object of the invention to provide a semiconductor circuit configuration having at least one pair of complementary or complementary acting or operating field-effect transistor devices in which the complementary field-effect transistor devices of the pair are formed to be coordinated with one another in a particularly simple manner. Furthermore, the invention is based on the object of forming a semiconductor memory device utilizing this procedure.

With the foregoing and other objects in view there is provided, in accordance with the invention, a semiconductor circuit configuration including: a capacitor configuration; and at least one pair of complementary or complementary acting field-effect transistor devices. Each of the complementary field-effect transistor devices has a gate region, a first source/drain region, a second source/drain region, and a channel region including or made of an organic semiconductor material configured between the first source/drain region and the second source/drain region. The capacitor configuration electrically couples the gate region of one of the complementary field-effect transistor devices to the gate region of another one of the complementary field-effect transistor devices.

In the invention's semiconductor circuit configuration having at least one pair of complementary or complementary acting or operating field-effect transistor devices, each of the complementary or complementary acting or operating field-effect transistor devices has a gate region, first and second source/drain regions and also a channel region with or made of an organic semiconductor material provided between the respective first and second source/drain regions. It is furthermore provided that the gate regions and, in particular, the gate electrodes thereof are formed such that they are electrically coupled to one another via a capacitor configuration.

It is thus a fundamental idea of the present invention, in the case of the complementary or complementary acting or operating field-effect transistor devices, to form the channel region with or from an organic semiconductor material and to realize the coupling of the gate regions of the complementary or complementary acting or operating field-effect transistor devices via a capacitor configuration.

Hereinafter, the description will always refer to complementary field-effect transistors for short, even if complementary acting or operating field-effect transistors are meant.

Furthermore, in accordance with a preferred embodiment of the semiconductor circuit configuration, the complementary field-effect transistor devices have the same organic semiconductor material in the respective channel regions, or the channel regions are in each case formed from the same organic semiconductor material. This means that the complementary field-effect transistor devices of the at least one pair are formed identically with regard to the organic semiconductor material.

In an advantageous manner, the complementary field-effect transistor devices may also be formed such that they intrinsically act identically or are identical. In contrast to the prior art, it is thus possible to have recourse to a single component type, thereby obviating the need to coordinate a p-type transistor with an n-type transistor. What is crucial in this case is the electrical coupling of the gate regions or gate electrodes of the complementary field-effect transistor devices via the capacitor configuration provided.

In another embodiment of the semiconductor circuit configuration, a p-conducting semiconductor material or an n-conducting semiconductor material is in each case provided as organic semiconductor material.

In particular, the provision of a p-conducting semiconductor material affords particular advantages if the organic semiconductor material for the channel regions has or is formed from a p-type semiconductor based on condensed aromatic compounds, for example, anthracene, tetracene, pentacene and/or the like, polythiophenes, for example, poly-3-alkylthiophenes, polyvinylthiophenes and/or the like, polypyrroles, organometallic complexes of phthalocyanine or porphyrin, in particular copper and/or the like.

In a further embodiment of the semiconductor circuit configuration, the gate electrode configuration of the gate regions is formed such that it is electrically insulated from the source/drain regions and the channel regions by at least one insulation region.

The optionally provided insulation regions will preferably have an inorganic and/or an organic substance or compound or be formed therefrom.

In this case, it is advantageous that polymers, polystyrene, polyethylene, polyester, polyurethane, polycarbonate, polyacrylate, polyimide, polyether, polybenzoxazoles and/or the like and/or mixtures or compounds thereof are provided as organic material for insulation regions.

On the other hand, silicon dioxide, silicon nitride, aluminum oxide, zinc oxide, hafnium oxide and/or the like and/or mixtures or compounds thereof are provided as inorganic material for insulation regions.

Furthermore, it is conceivable to provide a flexible substrate, in particular using metals, for example copper, nickel, gold, iron sheet and/or the like, plastics, for example, polystyrene, polyethylene, polyester, polyurethane, polycarbonate, polyacrylate, polyimide, polyether, polybenzoxazole and/or the like, paper and/or the like. At least the pair of field-effect transistor devices is formed on or in the flexible substrate.

In a particularly preferred embodiment of the semiconductor circuit configuration, the capacitor configuration is formed by a first capacitor device or has such a device. The first capacitor device has, as a first capacitor electrode, the gate electrode or the gate region of the first field-effect transistor device. In accordance with this measure, the gate electrode of the first field-effect transistor device also simultaneously forms one of the capacitor electrodes of the first capacitor device of the capacitor configuration. What is achieved in this way is that the potential which is present at the first capacitor device of the capacitor configuration, at the first capacitor electrode thereof, is also utilized as control potential for the first field-effect transistor device.

Furthermore, in this case a second capacitor electrode is then provided for the first capacitor device, and also a first dielectric region is formed between the first and second capacitor electrodes of the first capacitor device.

In a particularly preferred embodiment of the semiconductor circuit configuration, as a second capacitor electrode of the first capacitor device, the gate electrode or the gate region of the second field-effect transistor device is provided in such a way that this provides the electrical coupling of the first and second field-effect transistor device of the pair via the first dielectric region as common dielectric. In accordance with this preferred embodiment, it is thus provided that—as already described—the first capacitor electrode of the first capacitor device simultaneously forms the gate region or the gate electrode of the first field-effect transistor device and the first field-effect transistor device is thus controlled by the electrical potential present at the first capacitor electrode, and that the second capacitor electrode of the first capacitor device simultaneously functions as gate region or gate electrode of the second field-effect transistor device and thus controls the second field-effect transistor device by the opposite electrical potential—nevertheless of identical magnitude—of the identical first field-effect transistor device on the second capacitor electrode.

It becomes clear from this context that here actually identical field-effect transistor devices, for example, can be provided as first and second field-effect transistor devices because the control potentials at the gate regions of the first and second field-effect transistor devices, on account of the formation of the electric field and the potential difference in the first capacitor device, always have identical magnitudes but exactly opposite signs, so that it is always the case that one of the field-effect transistor devices is switched on, while the other is at the same time switched off.

In a further embodiment of the semiconductor circuit configuration, the first and second field-effect transistor devices of the pair are formed such that they are essentially mirror-symmetrical with regard to a plane running through the first dielectric region. This plane of symmetry may extend horizontally or vertically depending on the configuration of the semiconductor circuit configuration.

Other circuitry realizations for the electrical coupling of the first and second field-effect transistor devices are also conceivable.

In a further preferred embodiment of the semiconductor circuit configuration, a second capacitor device of the capacitor configuration is provided in addition to the first capacitor device. In this case, it is furthermore provided that the second capacitor device has, as a first capacitor electrode, the gate electrode or the gate region of the second field-effect transistor device. In accordance with this preferred embodiment, it is thus provided that the first capacitor electrode of the second capacitor device also simultaneously forms the gate electrode or the gate region of the second field-effect transistor device. Consequently, the electrical potential of the second capacitor device present at the first capacitor electrode of the second capacitor device also simultaneously serves as control potential for the second field-effect transistor device.

In this case, it is then provided, in particular, that the second capacitor device has a second capacitor electrode and a second dielectric region formed between the first and second capacitor electrodes.

In this case, in accordance with a further preferred embodiment of the semiconductor circuit configuration, the second capacitor electrodes of the first and second capacitor devices are formed in one part or in one piece as a coupling electrode common to the first and second capacitor devices. This configuration produces, in a particularly simple manner, the electrical coupling of the first and second field-effect transistor devices via the electrode triplet, including the first capacitor electrodes of the first and second capacitor devices and the common coupling electrode as second capacitor electrode for the first and second capacitor devices.

In this case, it is furthermore advantageous if the first and second dielectric regions of the first and second capacitor devices are formed as a dielectric region common to the first and second capacitor devices, in particular in one-part or one-piece form.

In this embodiment, it is advantageous for reasons of symmetry that the first and second field-effect transistor devices of the pair are formed such that they are mirror-symmetrical with regard to a plane that is perpendicular to a common plane of the first and second dielectric regions or to the plane of the common dielectric region. This plane of symmetry, too, may be oriented horizontally or vertically.

The electrical coupling of the first and second field-effect transistor devices can be realized particularly advantageously if the first and second dielectric regions or, if appropriate, the common dielectric region are a ferroelectric storage dielectric. This is because the first and second dielectric regions or the regions of the optionally provided common dielectric region which are assigned to the first and second field-effect transistor devices, using the first capacitor electrodes and/or the common coupling electrode, can then be provided separately with a remanent polarization, which, upon the switching off of an external field or an external potential via the respective first capacitor electrodes, then influence the channel regions of the first and second field-effect transistor devices and switch the first and second field-effect transistor devices on and off in a complementary manner.

In this case, it is advantageous if the ferroelectric storage dielectric has or is formed from an inorganic material, for example, strontium bismuth tantalate SBT, lead zirconium titanate PZT and/or the like.

As an alternative or in addition, the ferroelectric storage dielectric has or is formed from an organic material, for example, a polymeric ferroelectric based on fluorinated polyenes, polyvinylidene difluoride PVDF, polytrifluoroethylene PTrFE and/or the like and/or the copolymers or terpolymers thereof.

In the electrical coupling of the first and second field-effect transistor devices, it is advantageous that either the first or the second gate electrode device of the first or second field-effect transistor device is formed as a free electrode or as a floating gate.

Furthermore, the semiconductor circuit configuration is formed and used as a semiconductor memory cell.

A further aspect of the present invention provides a semiconductor memory device that has a plurality of the inventive circuit configurations as memory cells.

In an advantageous development of the semiconductor memory device, the connection from the source/drain regions and/or the gate regions of a given semiconductor memory cell to other memory cells of the semiconductor memory device is formed by directly connecting the mutually corresponding respective conductive source/drain regions and/or the mutually corresponding gate regions.

In a preferred embodiment of the semiconductor memory device, the connection of the source/drain regions and/or gate regions of a given semiconductor memory cell to other memory cells of the semiconductor memory device is formed by using an additional metalization, metal track or the like, which in particular, includes corresponding contacts.

These and further aspects of the present invention emerge from the observations listed below:

Electronics based on organic or organometallic compounds is discussed for applications (ID tags, smart cards etc.) that need have a low performance in comparison with chips fabricated from silicon. The price permitted for these systems can no longer be achieved by silicon-based electronics.

The possibility of fabricating complementary operating components similar to CMOS also arises. What is important in this case is that the charge carrier mobilities of organic n-type semiconductors are too low overall. Moreover, the organic n-type semiconductors react sensitively with regard to atmospheric oxygen on account of their oxidation potential. Therefore, a combination of n-type and p-type transistors based on organic semiconductors is problematic for the construction of complementary components.

This invention describes, for example, a transistor pair of a single type, here p-type, which is coupled via a capacitor and thereby operates complementary. If a ferroelectric material is used as the capacitor dielectric, this element can also be used for nonvolatile memory applications.

To date, complementary electronics have always been built up with a pair including n-channel and p-channel transistors.

The problem is solved by virtue of the fact that the gate electrodes of two transistors in pure p-channel or pure n-channel technology can be coupled via a capacitor. The complementary mode of operation is constrained by the opposite polarity at the capacitor/gate electrodes.

It is advantageous that only one organic semiconductor has to be deposited in the fabrication of this element.

The unity in the transistor architecture means that it is not necessary to adapt the charge carrier mobilities of n- and p-channel transistors.

The ferroelectricity of PVDF (polyvinylidene difluoride)-based polymers can be utilized in order to construct a polymer-based rewriteable, nonvolatile memory element.

The gate electrode and a capacitor electrode of the component are fabricated in one step.

The operating point of the capacitor can be adapted to the polymer-based transistors by varying the layer thickness (5–50 V).

The size of the semiconductor components is noncritical since inexpensive substrate material (polymer films, paper) is worked with and the price is not determined by the chip size.

One idea of the invention thus resides in the construction of a component including two transistors, whose gate electrodes are coupled via a capacitor.

In this case, one electrode of the capacitor simultaneously forms the gate electrode of a constructed field-effect transistor. The further components of the transistor are formed by the gate dielectric, the source electrode and the drain electrode. The channel is formed at the interface between the organic semiconductor and the gate dielectric.

In order to explain the functioning, it is assumed that the organic semiconductor is formed from the p-type channel material pentacene. The capacitor is polarized such that the negative polarization charge is situated at one electrode, while the positive polarization charge is situated at the other electrode. After a corresponding potential gradient has been applied to the source and drain electrodes, current flows since the transistor is in the on state. In a complementary manner with respect thereto, the transistor is in the off state.

If a ferroelectric is used as a dielectric, this switching state can be repeatedly read out as long as the polarization is not changed.

The substrate materials used are highly diverse. Examples that are mentioned here are flexible films made of metal (copper, nickel, gold, iron sheet, etc.), plastics (polystyrene, polyethylene, polyester, polyurethanes, polycarbonates, polyacrylates, polyimides, polyether, polybenzoxazoles, etc.) or paper. Suitable organic semiconductors are the p-type semiconductors based on condensed aromatic compounds (anthracene, tetracene, pentacene), polythiophene (poly-2-alkylthiophenes, polyvinylthiophene), polypyrroles or the organometallic complexes (Cu) of phthalocyanine or porphyrin.

The dielectrics may be either of inorganic or of organic nature. The integration of the inorganic dielectrics silicon dioxide or silicon nitride has been successfully demonstrated. Polystyrene, polyethylene, polyester, polyurethanes, polycarbonates, polyacrylates, polyimides, polyether, polybenzoxazoles are particularly suitable because of their potential printability.

For the ferro-variant, the polymeric ferroelectrics based on fluorinated polyenes, such as polyvinylidene difluoride, polytrifluoroethylenes or the copolymers or terpolymers thereof, are particularly suitable because of their chemical stability or their good processability. Inorganic materials such as SBT (strontium bismuth tantalate) or PZT (lead zirconium titanate) in a thin layer are equally suitable because of their moderate flexibility.

For the fabrication of the electrodes and connecting lines between the cells and the transistors, metals (Pd, Au, Pt, Ni, Cu, Ti etc.) are suitable because of their low nonreactive resistance. For less stringent demands, it is also possible to use organic doped semiconductors such as camphorsulfonic-acid-doped polyaniline or polystyrenesulfonic-acid-doped polythiophenes.

Other features which are considered as characteristic for the invention are set forth in the appended claims.

Although the invention is illustrated and described herein as embodied in a semiconductor circuit configuration and semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a diagrammatic equivalent circuit diagram for the embodiment shown in FIG. 1;

FIG. 3B is a diagrammatic equivalent circuit diagram for the embodiment shown in FIG. 2;

DESCRIPTION OF THE PREFERRED EMBODIMENTS

Figure 1:
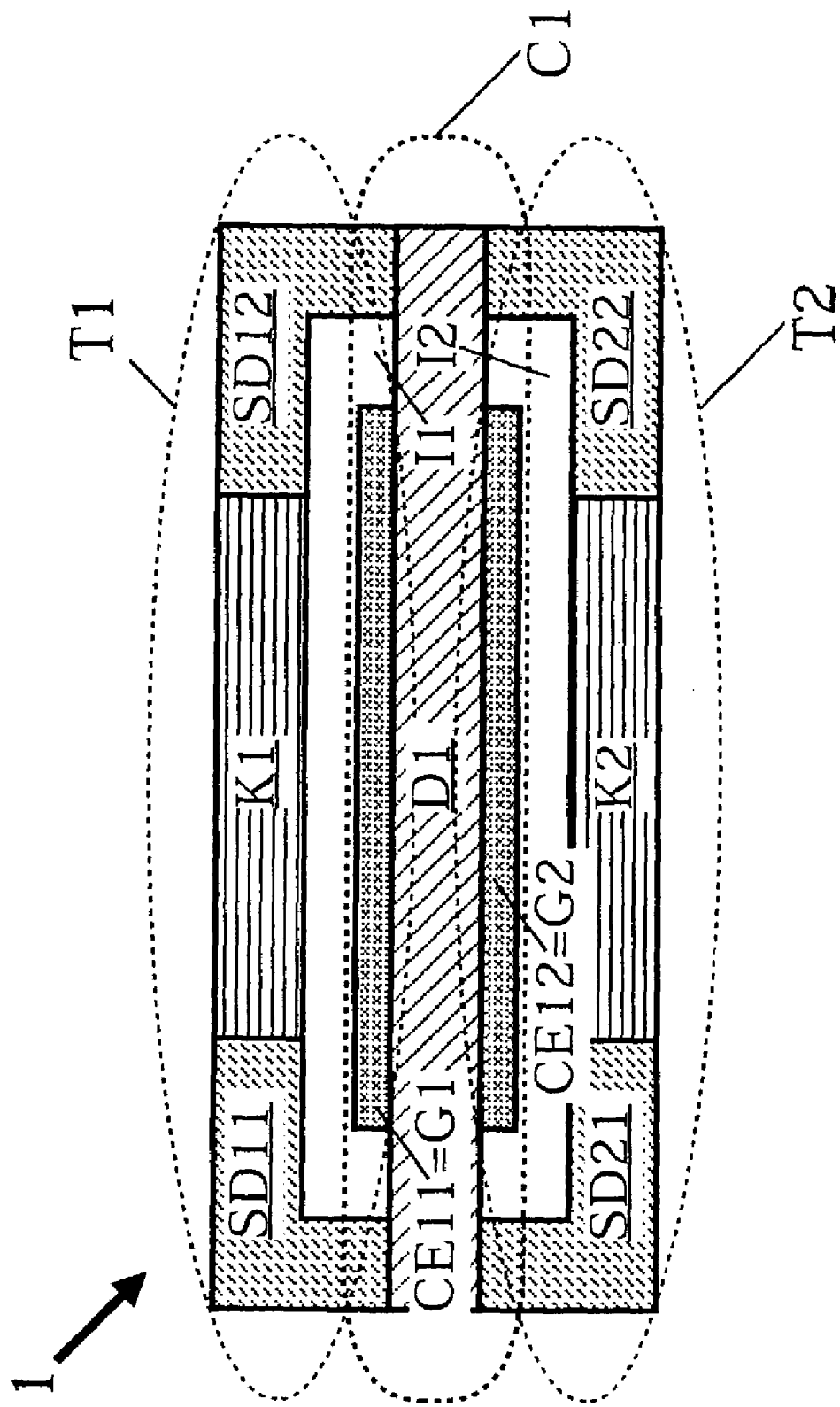
FIG. 1 is a diagrammatic and sectional side view of a first embodiment of the semiconductor circuit configuration.

Referring now to the figures of the drawing in detail and first, particularly, to FIG. 1 thereof, there is shown a diagrammatic and sectional side view of a first embodiment of the inventive semiconductor circuit configuration 1.

The illustration shows a first field-effect transistor device T1 and a second field-effect transistor device T2, which form the pair of field-effect transistor devices.

The field-effect transistor device T1 has first and second source/drain regions SD11, SD12. A channel region K1 made of an organic semiconductor material is formed between the source/drain regions SD11, SD12. Furthermore, a first gate electrode G1 is provided between the source/drain regions SD11 and SD12. The gate electrode is electrically insulated from the source/drain regions SD11, SD12 and from the channel region K1 by a first insulation region I1. A first dielectric region D1 then follows toward the bottom.

The second field-effect transistor device T2 is provided mirror-symmetrically opposite the first dielectric region D1 and the first field-effect transistor device T1. The second field-effect transistor device is formed essentially in a manner corresponding to the first field-effect transistor device T1. A channel region K2 is provided between the first and second source/drain regions SD21, SD22. Likewise, between the first and second source/drain regions SD21, SD22, the second gate electrode G2 is provided in a manner insulated from the source/drain regions SD21, SD22 and the channel region K2 of the second field-effect transistor device T2 by a second insulation region I2.

The configuration shown in FIG. 1 thus has the result that the first and second gate electrodes G1 and G2 or gate regions of the first and second field-effect transistor devices T1, T2, together with the first dielectric region D1, form a first, and in this case sole, capacitor device C1. The electrical coupling of the two field-effect transistor devices T1 and T2 then takes place via the first and sole capacitor device C1, for example, by driving the first capacitor electrode CE11, which is identical to the first gate electrode G1, with a predetermined potential. In this case, the second capacitor electrode CE12, which is identical to the second gate electrode G2, remains floating.

The embodiment of FIG. 2 differs from the embodiment of FIG. 1 in that the second field-effect transistor device T2 is not configured below the first field-effect transistor device T1, but rather is offset laterally with respect thereto at the same height. In this case, a second dielectric region D2 for the second field-effect transistor device T2 is provided such that the two dielectric regions D1 and D2 form a common and contiguous dielectric region D for both field-effect transistor devices T1 and T2. Separate dielectric regions D1, D2 are also conceivable.

Figure 2:
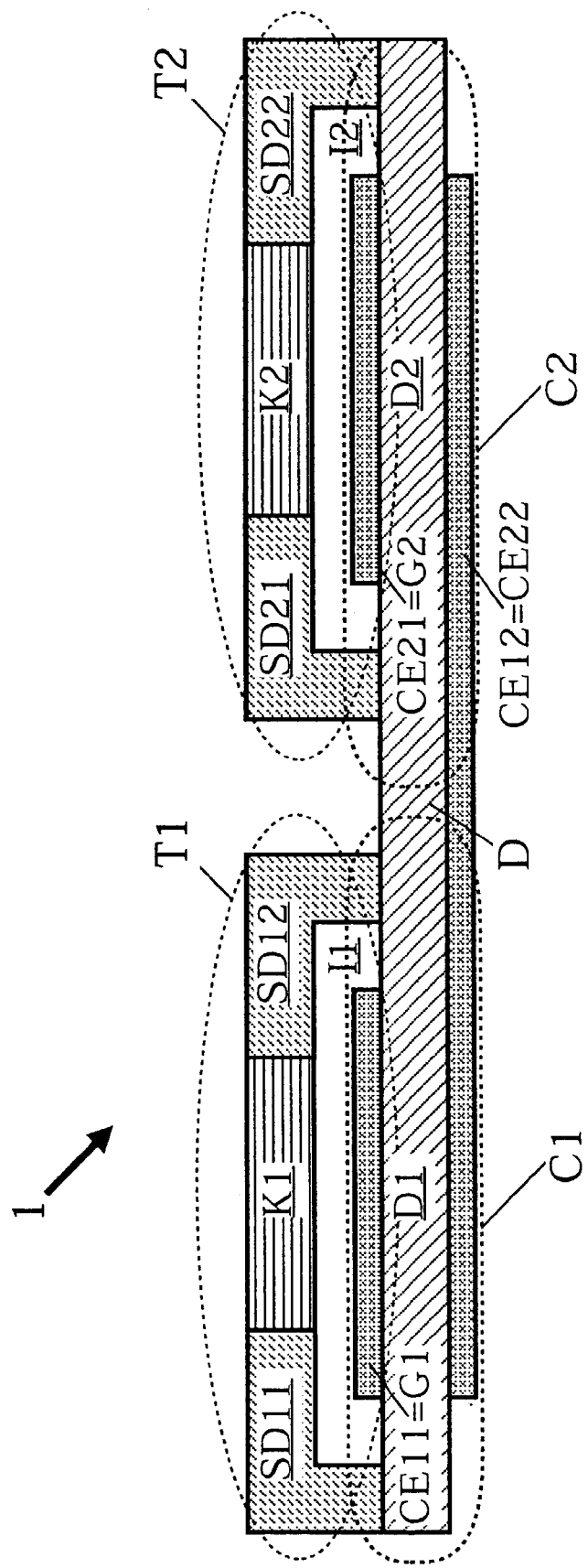
FIG. 2 is a diagrammatic and sectional side view of a second embodiment of the semiconductor circuit configuration.

In the exemplary embodiment of FIG. 2, the second gate electrode G2 of the second field-effect transistor device T2 functions as a first capacitor electrode CE21 of a second capacitor device C2, which is completed by the dielectric D already mentioned and by a common coupling electrode which is provided on the side of the dielectric D remote from the field-effect transistor devices T1, T2 and simultaneously forms the second electrodes CE12, CE22 of the first and second capacitor devices C1, C2.

FIGS. 3A and 3B show the equivalent circuit diagrams for the embodiments of FIGS. 1 and 2. It becomes clear that the two field-effect transistor devices T1 and T2 are coupled via the respective capacitor configuration with the individual capacitors C1 and C2, but that otherwise the field-effect transistor devices T1 and T2 may be identical. This means that both field-effect transistor devices T1 and T2 may be either n-type or p-type.

Figure 3C:
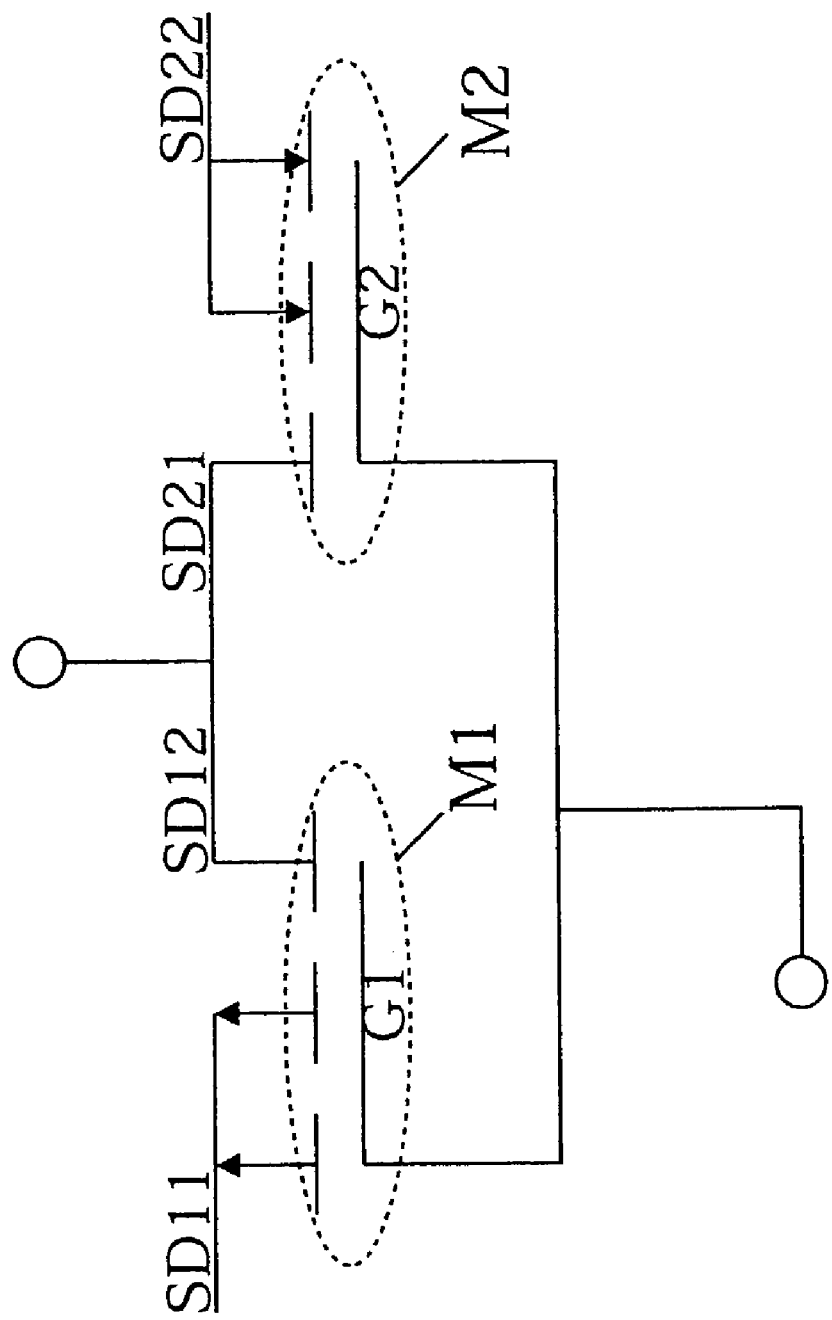
FIG. 3C is a diagrammatic equivalent circuit diagram for a prior art semiconductor circuit configuration.
Figure 4:
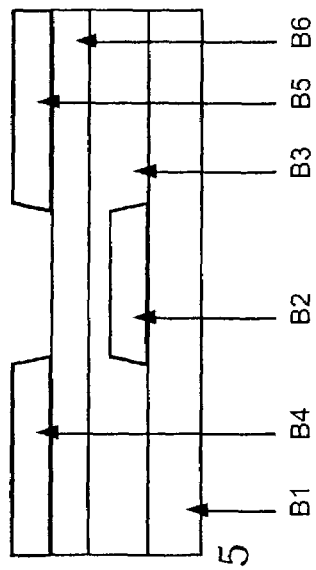
FIGS. 4–9 show six different structures of field-effect transistor devices using organic semiconductor materials.
Figure 5:
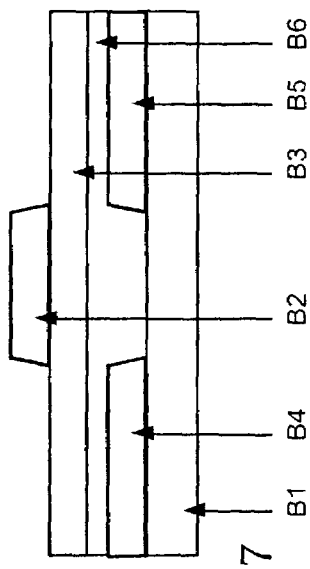
Figure 6:
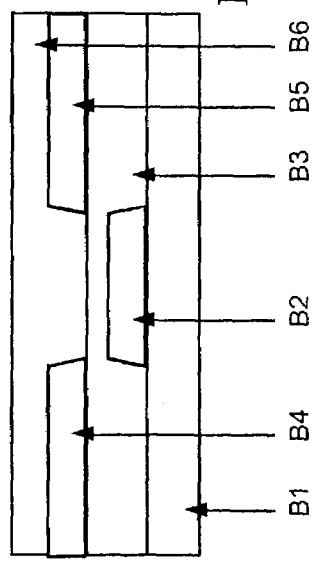
Figure 7:
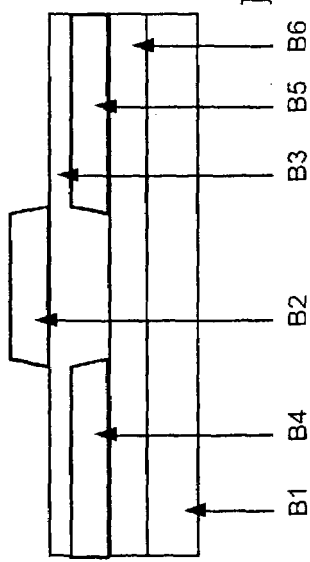
Figure 8:
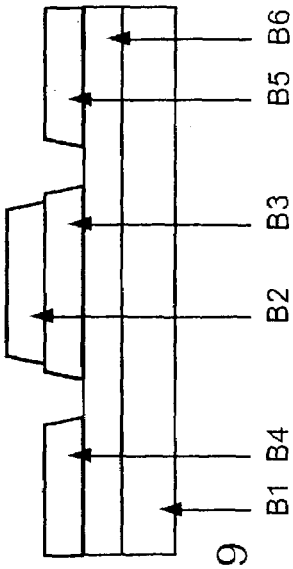
Figure 9:
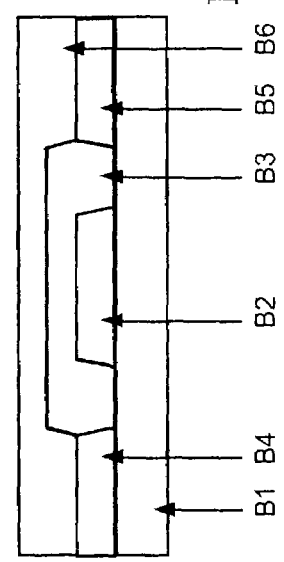

In contrast to this, the equivalent circuit diagram shown in FIG. 3C for a conventional semiconductor circuit configuration of complementary field-effect transistor devices M1, M2 shows that the latter are provided with identically driven gate electrodes G1 and G2 and that the elementary properties of the first and second conventional field-effect transistor devices M1 and M2 consequently have to be different, so that M1 and M2 have to be chosen as n-type and p-type, or p-type and n-type, thereby producing the complementary switching behavior in a conventional manner.

FIGS. 4 to 9 show sectional side views of field-effect transistor devices based on the present invention using organic semiconductor materials. The same reference symbols always designate the same or identically acting elements in all of the figures.

The gate electrode B2, the gate dielectric layer B3, the source contacts B4, the drain contacts B5, and the organic semiconductor layer B6 are in each case deposited successively in a corresponding order onto a suitable substrate B1 and are patterned in accordance with the required topological properties.

We claim:

1. A semiconductor circuit configuration, comprising:
   a capacitor configuration; and
   at least one pair of complementary or complementary acting field-effect transistor devices;
   each of said complementary field-effect transistor devices having a gate region, a first source/drain region, a second source/drain region, and a channel region including or made of an organic semiconductor material configured between said first source/drain region and said second source/drain region; and said capacitor configuration electrically coupling said gate region of one of said complementary field-effect transistor devices to said gate region of another one of said complementary field-effect transistor devices.

2. The semiconductor circuit configuration according to claim 1, wherein:
said gate region of each of said complementary field-effect transistor devices includes a gate electrode; and
said capacitor configuration electrically couples said gate electrode of one of said complementary field-effect transistor devices to said gate electrode of said another one of said complementary field-effect transistor devices.

3. The semiconductor circuit configuration according to claim 1, further comprising an organic semiconductor material provided in said channel region of one of said complementary field-effect transistor devices and provided in said channel region of another one of said complementary field-effect transistor devices.

4. The semiconductor circuit configuration according to claim 1, wherein said channel region of each of said complementary field-effect transistor devices includes an organic p-conducting semiconductor material.

5. The semiconductor circuit configuration according to claim 1, wherein said channel region of each of said complementary field-effect transistor devices includes an organic n-conducting semiconductor material.

6. The semiconductor circuit configuration according to claim 1, wherein said channel region of each of said complementary field-effect transistor devices includes or is formed from an organic p-conducting semiconductor material based on a condensed aromatic compound.

7. The semiconductor circuit configuration according to claim 6, wherein said aromatic compound is selected from a group consisting of anthracene, tetracene, and pentacene.

8. The semiconductor circuit configuration according to claim 1, wherein said channel region of each of said complementary field-effect transistor devices includes or is formed from an organic p-conducting semiconductor material based on a polythiophene.

9. The semiconductor circuit configuration according to claim 8, wherein said polythiophene is selected from a group consisting of poly-3-alkylthiophenes and polyvinylthiophenes.

10. The semiconductor circuit configuration according to claim 1, wherein said channel region of each of said complementary field-effect transistor devices includes or is formed from an organic p-conducting semiconductor material based on a polypyrrole, an organometallic complex of phthalocyanine, or an organometallic complex of porphyrin.

11. The semiconductor circuit configuration according to claim 1, wherein said channel region of each of said complementary field-effect transistor devices includes or is formed from an organic p-conducting semiconductor material based on an organometallic complex of phthalocyanine and copper, or an organometallic complexe of porphyrin and copper.

12. The semiconductor circuit configuration according to claim 1, wherein:
said gate region of each of said complementary field-effect transistor devices includes a gate electrode configuration; and
each of said complementary field-effect transistor devices includes at least one insulation region electrically insulating said gate electrode configuration of said gate region thereof from said first source/drain region thereof, said second source/drain region thereof, and said channel region thereof.

13. The semiconductor circuit configuration according to claim 12, wherein said insulation region includes at least one material selected from a group consisting of an inorganic substance, an organic substance, and a compound formed from said inorganic substance and said organic substance.

14. The semiconductor circuit configuration according to claim 12, wherein said insulation region includes an organic material selected from a group consisting of a polymer, polystyrene, polyethylene, polyester, polyurethane, polycarbonate, polyacrylate, polyimide, polyether, and polybenzoxazoles.

15. The semiconductor circuit configuration according to claim 12, wherein said insulation region includes an organic mixture of at least two materials selected from a group consisting of a polymer, polystyrene, polyethylene, polyester, polyurethane, polycarbonate, polyacrylate, polyimide, polyether, and polybenzoxazoles.

16. The semiconductor circuit configuration according to claim 12, wherein said insulation region includes an organic compound of at least two materials selected from a group consisting of a polymer, polystyrene, polyethylene, polyester, polyurethane, polycarbonate, polyacrylate, polyimide, polyether, and polybenzoxazoles.

17. The semiconductor circuit configuration according to claim 12, wherein said insulation region includes an inorganic material selected from a group consisting of silicon dioxide, silicon nitride, aluminum oxide, zinc oxide, and hafnium oxide.

18. The semiconductor circuit configuration according to claim 12, wherein said insulation region includes an inorganic mixture including at least two materials selected from a group consisting of silicon dioxide, silicon nitride, aluminum oxide, zinc oxide, and hafnium oxide.

19. The semiconductor circuit configuration according to claim 12, wherein said insulation region includes an inorganic compound including at least two materials selected from a group consisting of silicon dioxide, silicon nitride, aluminum oxide, zinc oxide, and hafnium oxide.

20. The semiconductor circuit configuration according to claim 1, further comprising a flexible substrate; each of said complementary field-effect transistor devices formed on or in said substrate.

21. The semiconductor circuit configuration according to claim 1, wherein said substrate includes a metal selected from a group consisting of copper, nickel, gold, and iron sheet.

22. The semiconductor circuit configuration according to claim 1, wherein said substrate includes a plastic selected from a group consisting of polystyrene, polyethylene, polyester, polyurethane, polycarbonate, polyacrylate, polyimide, polyether, and polybenzoxazole.

23. The semiconductor circuit configuration according to claim 1, wherein said substrate includes paper.

24. The semiconductor circuit configuration according to claim 1, wherein:
said capacitor configuration includes a first capacitor device; and
said first capacitor device includes a first capacitor electrode formed by said gate region of said first field-effect transistor device.

25. The semiconductor circuit configuration according to claim 1, wherein:
said gate region of each of said complementary field-effect transistor devices includes a gate electrode;
said capacitor configuration electrically couples said gate electrode of one of said complementary field-effect transistor devices to said gate electrode of said another one of said complementary field-effect transistor devices;

said capacitor configuration includes a first capacitor device; and said first capacitor device includes a first capacitor electrode formed by said gate electrode of said first field-effect transistor device.

26. The semiconductor circuit configuration according to claim 25, wherein said first capacitor device includes a second capacitor electrode and a dielectric region formed between said first capacitor electrode and said second capacitor electrode.

27. The semiconductor circuit configuration according to claim 26, wherein:

said pair of field-effect transistor devices includes a first field-effect transistor device and a second field-effect transistor device;

said second capacitor electrode of said first capacitor device and said gate region of said second field-effect transistor device electrically couples said first field-effect transistor device and said second field-effect transistor device via said dielectric region; and said dielectric region serves as a common dielectric.

28. The semiconductor circuit configuration according to claim 27, wherein said first field-effect transistor device and said second field-effect transistor device are formed essentially mirror-symmetrically with regard to a plane running through said dielectric region.

29. The semiconductor circuit configuration according to claim 27, wherein:

said capacitor configuration has a second capacitor device; and said second capacitor device includes a first capacitor electrode formed by said gate region of said second field-effect transistor device.

30. The semiconductor circuit configuration according to claim 27, wherein:

said capacitor configuration has a second capacitor device; and said second capacitor device includes a first capacitor electrode formed by said gate electrode of said second field-effect transistor device.

31. The semiconductor circuit configuration according to claim 26, wherein said first field-effect transistor device and said second field-effect transistor device are formed essentially mirror-symmetrically with regard to a plane running through said dielectric region.

32. The semiconductor circuit configuration according to claim 26, wherein:

said capacitor configuration has a second capacitor device; and said second capacitor device includes a first capacitor electrode formed by said gate region of said second field-effect transistor device.

33. The semiconductor circuit configuration according to claim 26, wherein:

said capacitor configuration has a second capacitor device; and said second capacitor device includes a first capacitor electrode formed by said gate electrode of said second field-effect transistor device.

34. The semiconductor circuit configuration according to claim 33, wherein said second capacitor device includes a second capacitor electrode and a second dielectric region formed between said first capacitor electrode of said second capacitor device and said second capacitor electrode of said second capacitor device.

35. The semiconductor circuit configuration according to claim 34, wherein said second capacitor electrode of said first capacitor device and said second capacitor electrode of said second capacitor device are formed in one piece as a coupling electrode common to said first capacitor device and said second capacitor devices.

36. The semiconductor circuit configuration according to claim 34, wherein said dielectric region of said first capacitor device and said second dielectric region of said second capacitor device are formed as a single dielectric region common to said first capacitor device and said second capacitor device.

37. The semiconductor circuit configuration according to claim 34, wherein said dielectric region of said first capacitor device and said second dielectric region of said second capacitor device are formed as a one-piece dielectric region common to said first capacitor device and said second capacitor device.

38. The semiconductor circuit configuration according to claim 34, wherein:

said pair of field-effect transistor devices includes a first field-effect transistor device and a second field-effect transistor device; and said first field-effect transistor device and said second field-effect transistor device are formed mirror-symmetrically with regard to a plane that is perpendicular to a plane of said dielectric region and to a plane of said second dielectric region.

39. The semiconductor circuit configuration according to claim 34, wherein:

said pair of field-effect transistor devices includes a first field-effect transistor device and a second field-effect transistor device;

said first field-effect transistor device and said second field-effect transistor device are formed mirror-symmetrically with regard to a plane that is perpendicular to a plane running through said dielectric region and said second dielectric region; and said dielectric region and said second dielectric region are formed as a common dielectric region.

40. The semiconductor circuit configuration according to claim 34, wherein said dielectric region and said second dielectric region are formed as a common ferroelectric storage dielectric.

41. The semiconductor circuit configuration according to claim 34, wherein said dielectric region and said second dielectric region are formed as or include a ferroelectric storage dielectric.

42. The semiconductor circuit configuration according to claim 41, wherein said ferroelectric storage dielectric has or is formed from an inorganic material.

43. The semiconductor circuit configuration according to claim 42, wherein said inorganic material is selected from a group consisting of strontium bismuth tantalate SBT and lead zirconium titanate PZT.

44. The semiconductor circuit configuration according to claim 41, wherein said ferroelectric storage dielectric has or is formed from an organic material.

45. The semiconductor circuit configuration according to claim 44, wherein said organic material is selected from a group consisting of fluorinated polyenes, polyvinylidene difluoride PVDF, polytrifluoroethylene PtrFE, copolymers of polyenes, polyvinylidene difluoride PVDF, or polytrifluoroethylene PtrFE, and terpolymers of polyenes, polyvinylidene difluoride PVDF, or polytrifluoroethylene PtrFE.

46. The semiconductor circuit configuration according to claim 33, wherein said second capacitor electrode of said first capacitor device and said second capacitor electrode of said second capacitor device are formed in one piece as a coupling electrode common to said first capacitor device and said second capacitor devices.

47. The semiconductor circuit configuration according to claim 1, wherein said gate region of one of said field-effect transistor devices is formed as a free electrode or as a floating gate.

48. The semiconductor circuit configuration according to claim 1, wherein said field-effect transistor devices are formed to essentially act identically.

49. The semiconductor circuit configuration according to claim 1, wherein said field-effect transistor devices are essentially identically formed.

50. The semiconductor circuit configuration according to claim 1, wherein said field-effect transistor devices and said capacitor configuration are formed as a semiconductor memory cell.

51. A semiconductor memory device, comprising:
  a plurality of semiconductor circuit configurations each including a capacitor configuration and at least one pair of complementary or complementary acting field-effect transistor devices;
  each of said complementary field-effect transistor devices having a gate region, a first source/drain region, a second source/drain region, and a channel region including or made of an organic semiconductor material configured between said first source/drain region and said second source/drain region; and
  said capacitor configuration of each respective one of said plurality of said semiconductor circuit configurations electrically coupling said gate region of one of said complementary field-effect transistor devices of said respective one of said plurality of said semiconductor circuit configurations to said gate region of another one of said complementary field-effect transistor devices of said respective one of said plurality of said semiconductor circuit configurations.

52. The semiconductor memory device according to claim 51, wherein:
  each one of said complementary field-effect transistor devices of each respective one of said plurality of said semiconductor circuit configurations includes a source/drain region; and
  said source/drain region of one of said complementary field-effect transistor devices of said respective one of said plurality of said semiconductor circuit configurations is directly connected to said source/drain region of another one of said complementary field-effect transistor devices of said respective one of said plurality of said semiconductor circuit configurations.

53. The semiconductor memory device according to claim 51, wherein:
  each one of said complementary field-effect transistor devices of each one of said plurality of said semiconductor circuit configurations includes a gate region; and
  said gate region of one of said complementary field-effect transistor devices of each respective one of said plurality of said semiconductor circuit configurations is directly connected to said gate region of another one of said complementary field-effect transistor devices of said respective one of said plurality of said semiconductor circuit configurations.

54. The semiconductor memory device according to claim 51, wherein:
  each one of said plurality of said semiconductor circuit configurations includes an additional metallization or a metal track;
  each one of said complementary field-effect transistor devices of each one of said plurality of said semiconductor circuit configurations includes a gate region; and
  said additional metallization or said metal track of each respective one of said plurality of said semiconductor circuit configurations directly connects said gate region of one of said complementary field-effect transistor devices of said respective one of said plurality of said semiconductor circuit configurations to said gate region of another one of said complementary field-effect transistor devices of said respective one of said plurality of said semiconductor circuit configurations.

55. The semiconductor memory device according to claim 54, wherein said additional metallization or said metal track includes contacts.

56. The semiconductor memory device according to claim 51, wherein:
  each one of said plurality of said semiconductor circuit configurations includes an additional metallization or a metal track;
  each one of said complementary field-effect transistor devices of each one of said plurality of said semiconductor circuit configurations includes a source/drain region; and
  said additional metallization or said metal track of each respective one of said plurality of said semiconductor circuit configurations directly connects said source/drain region of one of said complementary field-effect transistor devices of said respective one of said plurality of said semiconductor circuit configurations to said source/drain region of another one of said complementary field-effect transistor devices of said respective one of said plurality of said semiconductor circuit configurations.

57. The semiconductor memory device according to claim 56, wherein said additional metallization or said metal track includes contacts.

* * * * *